(12) United States Patent
Jeong

(10) Patent No.: US 6,545,358 B2
(45) Date of Patent: Apr. 8, 2003

(54) INTEGRATED CIRCUITS HAVING PLUGS IN CONDUCTIVE LAYERS THEREIN AND RELATED METHODS

(75) Inventor: Yong-sang Jeong, Kyungki-do (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 09/388,901

(22) Filed: Sep. 2, 1999

(65) Prior Publication Data

US 2002/0135070 A1 Sep. 26, 2002

(30) Foreign Application Priority Data

Sep. 16, 1998 (KR) ............................... 98-38200

(51) Int. Cl.[7] ................... H01L 23/48; H01L 23/52; H01L 29/40
(52) U.S. Cl. ............... 257/758; 257/759; 257/760; 257/763; 257/774; 438/629; 438/672; 438/675
(58) Field of Search ................. 257/622, 658, 257/758, 763, 764, 734, 750, 774, 775, 773, 751, 752, 739; 438/629, 672, 675

(56) References Cited

U.S. PATENT DOCUMENTS

| 4,933,743 A | * | 6/1990 | Thomas et al. ............. 257/742 |
| 5,595,936 A | * | 1/1997 | Choi et al. .................. 438/621 |
| 5,619,071 A | * | 4/1997 | Myers et al. ................ 257/753 |
| 5,635,763 A | * | 6/1997 | Inoue et al. ................ 257/763 |
| 5,710,462 A | * | 1/1998 | Mizushima .................. 257/758 |
| 5,739,049 A | * | 4/1998 | Park et al. ...................... 438/3 |
| 5,767,010 A | * | 6/1998 | Mis et al. .................... 438/614 |
| 5,932,907 A | * | 8/1999 | Grill et al. .................. 257/310 |
| 5,939,788 A | * | 8/1999 | McTeer ....................... 257/751 |
| 6,008,114 A | * | 12/1999 | Li ............................... 438/618 |
| 6,150,206 A | * | 11/2000 | Oh .............................. 438/238 |
| 6,194,309 B1 | * | 2/2001 | Jin ............................... 438/639 |

FOREIGN PATENT DOCUMENTS

| JP | 8-274172 | | 10/1996 |
| JP | 11054617 A | * | 2/1999 |
| JP | 11330399 A | * | 11/1999 |

* cited by examiner

Primary Examiner—Eddie Lee
Assistant Examiner—Chris Chu
(74) Attorney, Agent, or Firm—Myers Bigel Sibley & Sajovec

(57) ABSTRACT

An integrated circuit structure includes a first conductive layer, a first plug, an insulating layer, a second plug, and a second conductive layer. The first conductive layer is on a substrate wherein the first conductive layer has a recess in a surface thereof opposite the substrate, and the first plug is in the recess. The insulating layer is on the first conductive layer and on the first plug wherein the first insulating layer has a hole therein that exposes a portion of the first plug, and the second plug is in the hole. The second conductive layer is on the insulating layer and on the second plug in the hole opposite the substrate. In particular, a size of the recess can be greater than a size of the hole. An electrical resistance between the first and second conductive layers can thus be reduced. Related methods are also discussed.

30 Claims, 4 Drawing Sheets

INTEGRATED CIRCUITS HAVING PLUGS IN CONDUCTIVE LAYERS THEREIN AND RELATED METHODS

CROSS REFERENCE TO RELATED APPLICATION

This application claims the benefit of Korean Patent Application No. 98-38200, filed Sep. 16, 1998, the disclosure of which is hereby incorporated herein by reference.

FIELD OF INVENTION

The present invention relates to integrated circuits in general, and more particularly, to multi-layer wiring in integrated circuits.

BACKGROUND OF THE INVENTION

As the level of integration increases, the complexity and density of devices and structures in integrated circuits may also increase. As a result, multi-layered metal wiring may be used to achieve desired densities. It is known, for example, to form via holes filled with conductive material (or plugs) between different metal wiring layers in the integrated circuit to provide the desired interconnections between layers.

FIG. 1 is an enlarged cross-sectional view of a conventional multi-layer wiring structure in an integrated circuit. Referring to FIG. 1, a lower metal layer 3 is formed on a substrate 1. A capping layer 5 and an interlayer insulating layer 7 having a via hole 8 that exposes the lower metal layer 3 are formed on the lower metal layer 3. A plug 9 is formed in the via hole 8 and is connected to the lower metal layer 3. An upper metal layer 11 is formed on the plug 9 and the interlayer insulating layer 7. The lower metal layer 3 is electrically coupled to the upper metal layer 11 through the plug 9.

As the density of integrated circuit increases, however, spacing between via holes may be reduced and the contact surface area between the plug 9 and the upper and lower metal layers 11 and 3 may be reduced, which may increase the contact resistance therebetween.

Also, according to some conventional methods of forming multi-layered metal wiring, the plug 9 may be formed by depositing a plug metal layer and planarizing the plug metal layer using Chemical Mechanical Polishing (CMP) or an etch-back process. Unfortunately, the CMP or etch back process may cause the plug 9 to be separated from the via hole 8 or to be detached from the lower metal layer 3. Accordingly, there is a need for improved multi-layer wiring between metal layers in integrated circuits and related methods.

SUMMARY OF THE INVENTION

It is, therefore, an object of the present invention to allow improved multi-layer wiring structures in integrated circuits and related methods.

It is another object of the present invention to allow multi-layer wiring structures in integrated circuit structures that may provide reduced electrical resistance.

These and other objects of the present invention can be provided by integrated circuit structures that include a first conductive layer on a substrate, wherein the first conductive layer has a recess in a surface thereof, opposite the substrate and that include a first plug in the recess. An insulating layer on the first conductive layer and on the first plug has a hole therein that exposes a portion of the first plug. A second plug is in the hole and a second conductive layer is on the insulating layer and on the second plug in the hole. Accordingly, a contact area between the first plug and the lower metal layer can be increased, thus reducing a contact resistance therebetween.

In a further aspect of the present invention, the first plug can include a first plug surface in the recess in the first conductive layer and the second plug can include a second plug surface on the exposed portion of the first plug, wherein the first plug surface is larger than the second plug surface. In other words, the first plug can have a cross-sectional size greater than a cross-sectional size of the second plug, thus allowing a reduction in the resistance between the first and second conductive layers. In another aspect of the present invention, a cross-sectional size of the recess can be greater than a cross-sectional size of the hole. Since the first plug is formed in the recess having a larger cross-sectional size, the likelihood that the first plug will become detached from the recess or separated from the interface with the lower metal layer can be reduced.

In yet another aspect of the present invention, the first plug extends from the recess onto a surface of the first conductive layer adjacent the hole and opposite the substrate.

Structures and methods according to the present invention can thus provide reduced resistance between conductive layers in multi-layer wiring structures.

DETAILED DESCRIPTION OF THE EMBODIMENTS

Figure 1:
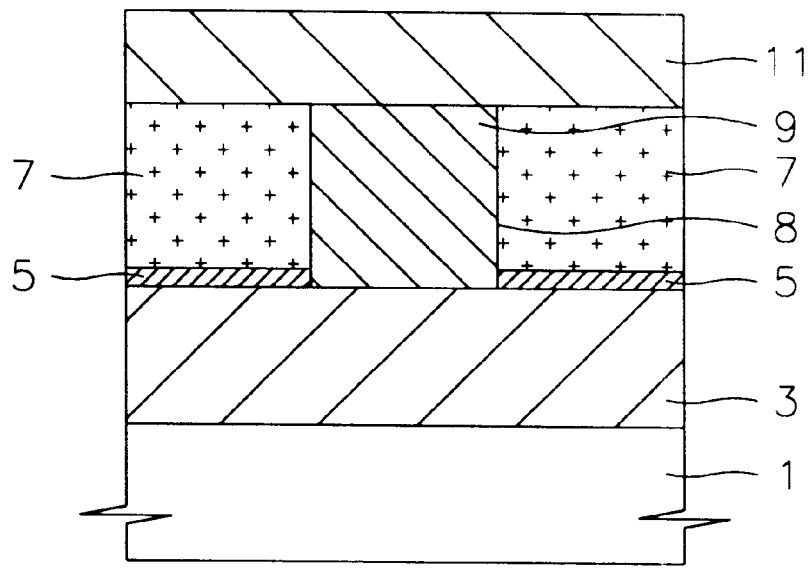
FIG. 1 is an enlarged cross-sectional view of a conventional multi-layer wiring structure in an integrated circuit.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will be understood that when an element such as a layer, region or substrate is referred to as being "on" another element, it can be directly on the other element or intervening elements may also be present. It will be understood that when an element such as a layer, region or substrate is referred to as being "electrically coupled" to another element, it can be directly connected to the other element or intervening elements may also be present wherein the electrical coupling takes place via the intervening elements. Like numbers refer to like elements throughout.

Figure 2:
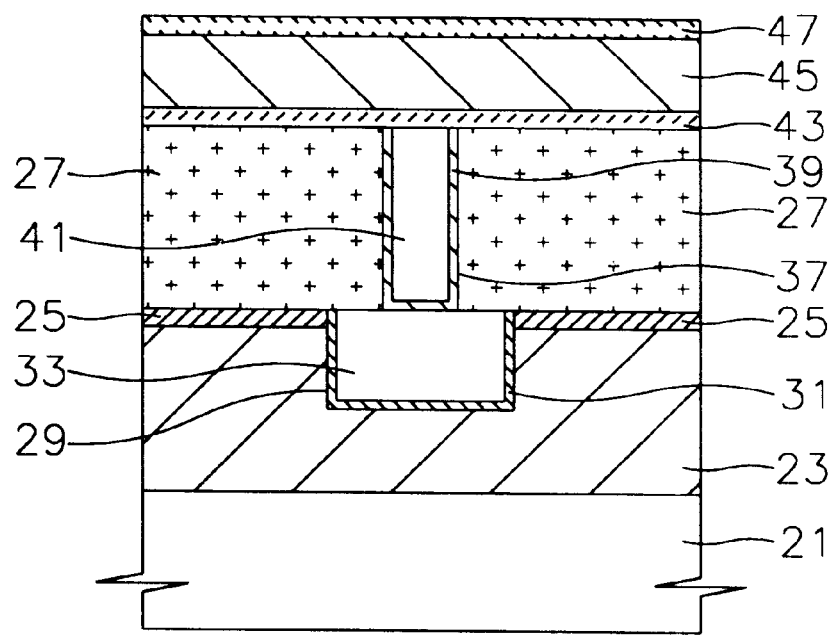
FIG. 2 is an enlarged cross-sectional view of a multi-layered metal wiring structure in an integrated circuit according to a first embodiment of the present invention.

FIG. 2 is an enlarged cross-sectional view of a multi-layered metal wiring structure in an integrated circuit according to a first embodiment of the present invention. In particular, a lower metal layer 23 can be formed to a thickness in a range between about 5000 to 16000 Angstroms (Å) on a substrate 21. The lower metal layer 23 can be formed using aluminum, aluminum alloy, or copper. A first capping layer 25 is formed on the surface of the lower metal layer 23. The first capping layer 25 may reduce reactions between the lower metal layer 23 and a later formed interlayer insulating layer 27 at the interface thereof to reduce formation of an alloy. The capping layer 25 may also lower the amount of light reflected during a subsequent lithography process. In the embodiment of FIG. 2, the first capping layer 25 can be a titanium nitride layer (TiN), however, other materials may be used.

A recess 29 is formed in the lower metal layer 23. The dimensions of the recess 29 can be larger than a critical dimension as defined by design rules for the process, and can have a larger cross-sectional size or diameter than a hole 37 that is formed later. Accordingly, a contact resistance can be reduced by increasing an area of contact between the lower metal layer 23 and a first plug 33 to be formed later. The first plug 33 may also be less likely to separate or detach from the recess 29 in a planarization process used to form the first plug 33.

A first barrier metal layer 31 can be formed on a wall of the recess 29. The first barrier metal layer 31 can include a titanium (Ti) layer and a titanium nitride layer (TiN). The titanium nitride layer may reduce reaction between the wall of the recess 29 in the lower metal layer 23 and the first plug 33. The titanium layer may allow the titanium nitride layer to easily contact the lower metal layer 23. The first plug 33 is formed on the first barrier metal layer 31 to fill the recess 29. The first plug 33 can comprise the same metal as a second plug 41 to be formed later. In the present embodiment, the first plug 33 can be formed of tungsten.

An interlayer insulating layer 27 is formed on the first plug 33 and on the first capping layer 25. A hole 37 having a smaller cross-sectional size or diameter than the recess 29 can be formed in the interlayer insulating layer 27 in conformity with the critical dimension as defined by design rules for the process. In other words, the hole 37 can be formed to have a cross-sectional dimension that is a smallest cross-sectional dimension provided according to design rules for the device. A second barrier metal layer 39 can be formed on the walls of the hole 37. The second barrier metal layer 39 can include a titanium (Ti) layer and a titanium nitride (TiN) layer. The titanium nitride layer may reduce reaction between the wall of the interlayer insulating layer 27 and a second plug 41 to be formed later. The titanium layer may allow the titanium nitride layer to more easily contact the interlayer insulating layer 27. The second plug 41 is formed in the hole 37 on the first plug 33 and is electrically coupled thereto. The second plug 41 may also be formed of tungsten, similarly to the first plug 33.

A second capping layer 43 is formed on the second plug 41, the second barrier metal layer 39, and the interlayer insulating layer 27. The second capping layer 43 may reduce reaction between the second plug 41, the interlayer insulating layer 27, and an upper metal layer 45 to be formed later thereon thus reducing formation of alloys. In one embodiment, the second capping layer 43 can be a titanium nitride layer (TiN). The upper metal layer 45 is formed on the second capping layer 43, and is electrically coupled to the lower metal layer 23 via the second plug 41 and the first plug 33. The upper metal layer 45 can be formed of aluminum, aluminum alloy, or copper to a thickness of 5000 to 16000 Å. A third capping layer 47 can be formed on the upper metal layer 45, and may reduce an interface reaction with a layer to be formed later thereon.

Figure 3:
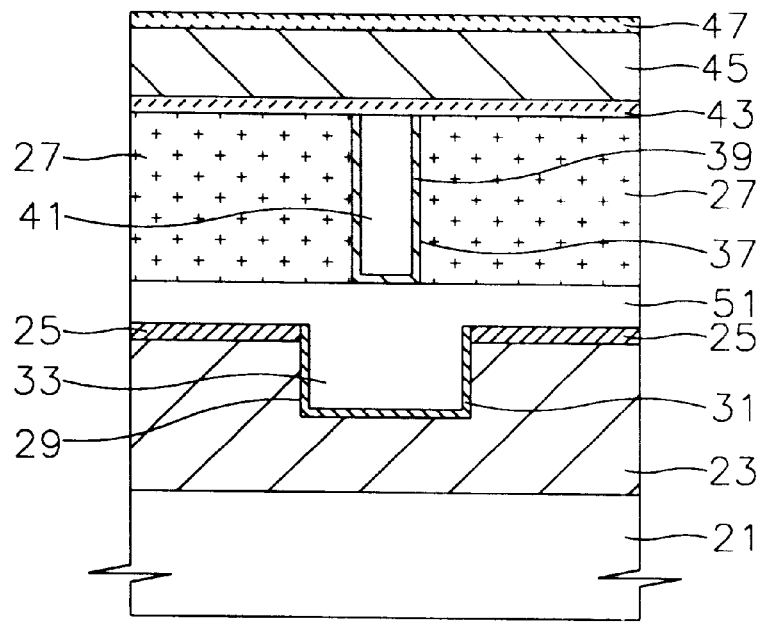
FIG. 3 is an enlarged cross-sectional view of a multi-layered metal wiring structure in an integrated circuit according to a second embodiment of the present invention.

FIG. 3 is an enlarged cross-sectional view of a multi-layered metal wiring structure in an integrated circuit structure according to a second embodiment of the present invention. In particular, the integrated circuit structure according to the second embodiment of the present invention is analogous to the first embodiment of FIG. 2 except that a first plug 51 fills the recess 29 and extends from the recess 29 opposite the substrate 21 on the first capping layer 25. In other words, the first plug 51 is formed on the surface of the lower metal layer 23 adjacent the recess 29. Since the first plug 51 contacts the surface of the lower metal layer 23, the contact resistance may be reduced.

Figure 4:
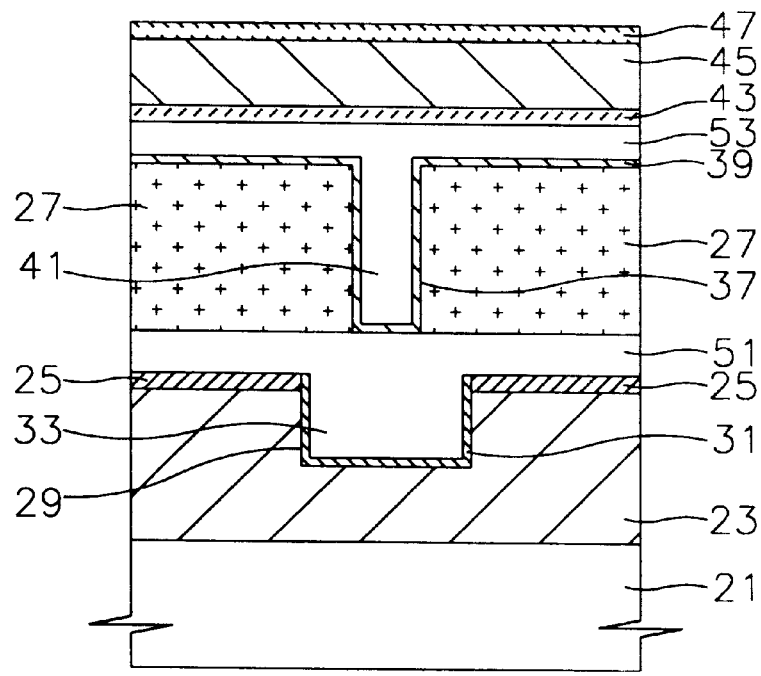
FIG. 4 is an enlarged cross-sectional view of a multi-layered metal wiring structure in an integrated circuit according to a third embodiment of the present invention

FIG. 4 is an enlarged cross-sectional view of a multi-layered wiring structure in an integrated circuit according to a third embodiment of the present invention. In particular, the integrated circuit structure according to the third embodiment of the present invention is analogous to the second embodiment of FIG. 3 except that a second plug 53 fills the hole 37 and extends from the hole 37 on the second barrier metal layer 39. In other words, the second plug 53 is formed on the surface of the interlayer insulating layer 27 and in the hole 37. Since the contact area between the second plug 53 and the upper metal layer 45 is increased, a contact resistance therebetween can be reduced. Also, as shown in FIG. 3, the first plug 51 contacts the surface of the lower metal layer 32, so that a contact resistance between the first plug 51 and the lower metal layer 23 can be reduced.

Figure 5:
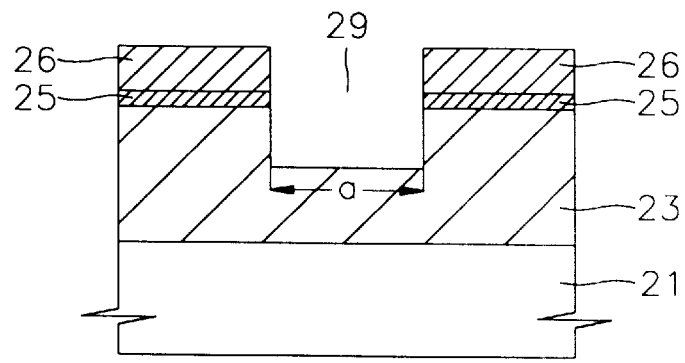
FIGS. 5 through 10 are enlarged cross-sectional views that illustrate methods of forming a multi-layered metal wiring structure shown in FIG. 2.

FIGS. 5 through 10 are enlarged cross-sectional views that illustrate methods of fabricating integrated circuit structures having multi-layered metal wiring as shown in FIG. 2. FIG. 5 shows the step of forming the lower metal layer 23 having the recess 29 on the substrate 21. In particular, the lower metal layer 23, having the recess 29 therein, can be formed to a thickness of 5000 to 16000 Å on the substrate 21. A capping layer 25, and an insulating layer 26 can be formed on the metal layer 23, and then the recess 29 can be formed therein using lithography and etch steps. As shown in FIG. 5, the recess 29 has a cross-sectional size or diameter of a which can be larger than a critical dimension as defined by design rules for the process. Thus, the contact area between the first plug 33 and the lower metal layer 23 can be enlarged to reduce the contact resistance therebetween.

The lower metal layer 23 can be formed of aluminum, aluminum alloy, or copper. The first capping layer 25 may reduce reactions between the lower metal layer 23 and the interlayer insulating layer 26 to reduce formation of alloys. The capping layer 25 may also reduce light reflection during the lithography step. The first capping layer 25 can be a titanium nitride (TiN) layer which is chemically and thermally stable and has a relatively low electrical resistance. The insulating layer 26 can be a silicon oxide layer.

Figure 6:
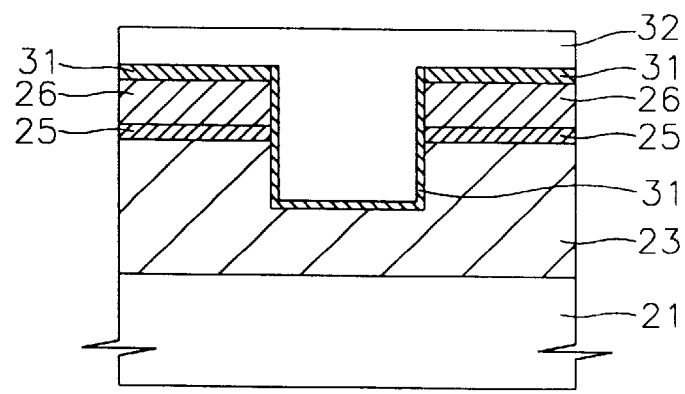

FIG. 6 illustrates a step of forming a first barrier metal layer 31 and a first plug metal layer 32. According to FIG. 6, a first barrier metal layer 31 is formed on the surfaces of the recess 29 and insulating layer 26. This first barrier metal layer 31 can be formed by sequentially depositing a thin titanium layer and a thin titanium nitride layer. The titanium nitride layer may prevent the wall of the lower metal layer 23 from reacting with the first plug formed later at the interface therebetween. The titanium layer may help the titanium nitride layer to more easily contact the lower metal layer 23. The formation of the first barrier metal is optional. A first plug metal layer 32 is deposited on the surface of the substrate 21 on which the first barrier metal layer 31 is formed. The first plug metal layer 32 can be formed of the same material as a second plug metal layer to be formed later. In one embodiment, a tungsten layer is used.

Figure 7:
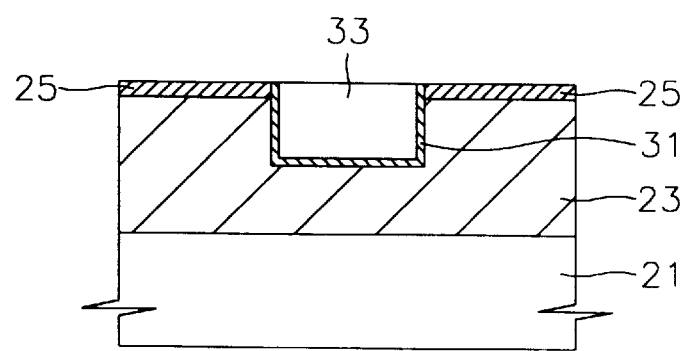

FIG. 7 illustrates a step of forming a first plug 33 according to the present invention. In particular, the first plug metal layer 32, the first barrier metal layer 31, and the insulating layer 26 are blanket-etched using the upper surface of the first capping layer 25 as an etch stop layer, thereby forming the first plug 33. Thus, the first barrier metal layer 31 remains on the wall of the recess 29. The blanket etch step can be a Chemical Mechanical Polishing (CMP) step or an etch-back step. In particular, CMP can improve the characteristics of the surface of the first plug 33. Also, since the first plug 33 has a relatively large cross-sectional size or diameter, the likelihood of the first plug 33 becoming detached from the recess 29 or being separated from the interface with the lower metal layer 23 can be reduced.

Figure 8:
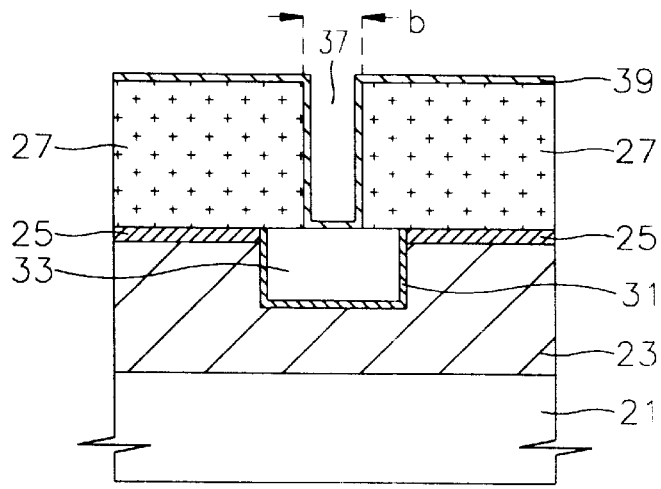

FIG. 8 illustrates a step of forming an interlayer insulating layer 27 and a hole 37 according to the present invention. In particular, an interlayer insulating layer 27 is formed on the first conductive layer 23 and on the first plug 33 opposite the substrates, and the interlayer insulating layer 27 is patterned using lithography and etch steps, thereby forming the hole 37 that exposes a portion of the surface of the first plug 33. The hole 37 has a cross-sectional size or diameter of b which can be less than the cross-sectional size or diameter of the recess 29 formed in FIG. 5.

A second barrier metal layer 39 can be formed on the surfaces of the hole 37 and the interlayer insulating layer 27. The second barrier metal layer 39 can be formed by sequentially depositing a thin titanium layer and then a thin titanium nitride layer. The titanium nitride layer may reduce reaction of the wall of the interlayer insulating layer 27 with a second plug to be formed later therein. The titanium layer may promote contact between the titanium nitride layer and the interlayer insulating layer 27. The second barrier metal layer 39 may then be formed.

Figure 9:
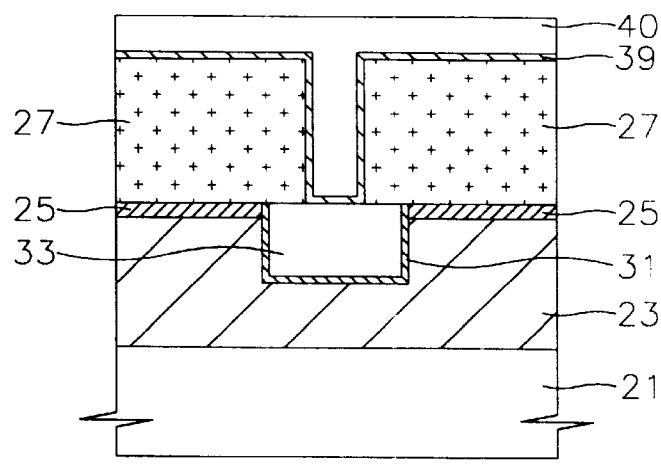

FIG. 9 illustrates a step of forming a second plug metal layer 40 according to the present invention. In particular, the second plug metal layer 40 is deposited on the second barrier metal layer 39. Preferably, the second plug metal layer 40 can be formed of tungsten.

Figure 10:
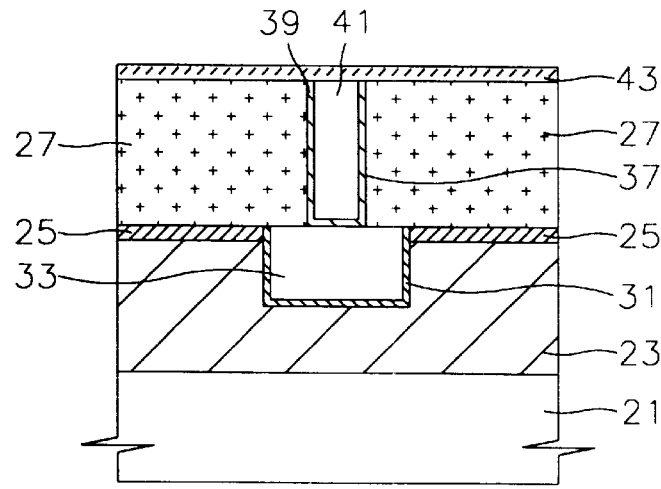

FIG. 10 illustrates a step of forming a second plug 41 according to the present invention. In particular, the second plug metal layer 40 and the second barrier metal layer 39 are blanket-etched using the upper surface of the interlayer insulating layer 27 as an etch stop layer, thereby forming the second plug 41. The blanket-etch step may be a CMP step or an etch-back step. CMP can improve the characteristics of the surface of the second plug 41. Thus, the second barrier metal layer 39 is formed on the walls of the hole 37.

Next, as shown in FIG. 2, the second capping layer 43, the upper metal layer 45, and the third capping layer 47 can be formed on the second plug 41, the second barrier metal layer 39, and the interlayer insulating layer 27, thereby completing formation of a multi-layered metal wiring structure. The second and third capping layers 43 and 47 can comprise a titanium nitride layer, and the upper metal layer 45 can be formed of aluminum, aluminum alloy, or copper to a thickness of 5000 to 16000 Å.

In an integrated circuit structure according to the present invention, a recess having a relatively large cross-sectional size or diameter is formed in a lower metal layer, and a first plug is formed in the recess. Thus, a contact area between the first plug and the lower metal layer can be increased, thereby reducing a contact resistance therebetween. Also, since the first plug is formed in the recess having a relatively large cross-sectional size or diameter, the likelihood that the first plug becomes detached from the recess or separated from the interface with the lower metal layer can be reduced.

A second plug is formed in a hole in an interlevel insulating layer and contacts the first plug and the surface of the upper metal layer to provide an electrical connection between the second plug and the upper metal layer. Accordingly, the contact resistance between the lower and upper metal layers can be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit structure comprising:
    a first conductive layer on a substrate wherein the first conductive layer has a recess in a surface thereof opposite the substrate;
    a first plug in the recess wherein the first plug extends onto the surface of the first conductive layer outside the recess and opposite the substrate;
    an insulating layer on the first conductive layer and on the first plug wherein the first insulating layer has a hole therein that exposes a portion of the first plug;
    a second plug in the hole; and
    a second conductive layer on the insulating layer and on the second plug opposite the substrate, wherein the first plug includes a first plug surface over the recess on the first conductive layer and the second plug includes a second plug surface on the exposed portion of the first plug, and wherein the first plug surface is larger than the second plug surface.

2. The integrated circuit structure of claim 1, wherein a size of the recess is greater than a size of the hole.

3. The integrated circuit structure of claim 1, wherein the first plug comprises a material and the second plug comprises the material.

4. The integrated circuit structure of claim 1, wherein the first and second plugs comprise tungsten.

5. The integrated circuit structure of claim 1, wherein the second plug extends onto a surface of the insulating layer outside the hole and opposite the substrate.

6. The integrated circuit structure of claim 1 further comprising:
    a barrier conductive layer on a wall of the recess in the first conductive layer.

7. The integrated circuit structure of claim 6, wherein the barrier conductive layer comprises titanium.

8. The integrated circuit structure of claim 1 further comprising:
    a barrier conductive layer on a wall of the hole in the insulating layer.

9. The integrated circuit structure of claim 8, wherein the barrier conductive layer comprises titanium.

10. The integrated circuit structure of claim 1 further comprising:
    a capping layer on the second plug.

11. The integrated circuit structure of claim 10, wherein the capping layer comprises titanium nitride.

12. The integrated circuit structure of claim 1, wherein the recess has an uniform cross-section.

13. The integrated circuit structure of claim 1, wherein a cross-section of the recess is greater than a cross-section of the hole.

14. A method of forming an integrated circuit structure comprising:

forming a first conductive layer on a substrate wherein the first conductive layer has a recess in a surface thereof opposite the substrate;

forming a first plug in the recess wherein the step of forming the first plug comprises forming the first plug to extend onto the surface of the first conductive layer outside the recess and opposite the substrate;

forming an insulating layer on the first conductive layer and on the first plug wherein the first insulating layer has a hole therein exposing a portion of the first plug;

forming a second plug in the hole; and forming a second conductive layer on the insulating layer and on the second plug opposite the substrate, wherein the step of forming the first plug comprises the step of forming a first plug surface over the recess on the first conductive layer and the step of forming the second plug comprises the step of forming a second plug surface on the exposed portion of the first plug, and wherein the first plug surface is larger than the second plug surface.

15. The method of claim 14, wherein the step of forming the first conductive layer comprises the step of forming the recess having a recess size wherein a size of the hole is less than the recess size.

16. The method of claim 14, wherein the step of forming the second plug comprises the step of forming the second plug to extend onto a surface of the insulating layer outside the hole and opposite the substrate.

17. The method of claim 14, wherein the first plug comprises a material and the second plug comprises the material.

18. The method of claim 14, wherein the first and second plugs comprise tungsten.

19. The method of claim 14, wherein the step of forming the first plug in the recess precedes the step of forming the insulating layer.

20. The method of claim 14, wherein the step of forming the first plug comprises the steps of:

forming a metal layer in the recess and on a surface of the first conductive layer opposite the substrate; and etching the metal layer to expose the surface of the first conductive layer opposite the substrate.

21. The method of claim 20, wherein the step of etching comprises the step of etching using at least one of chemical mechanical polishing and etching-back.

22. The method of claim 14 further comprising the step of forming a barrier conductive layer on a wall of the recess in the first conductive layer.

23. The method of claim 22, wherein the barrier conductive layer comprises titanium.

24. The method of claim 14 further comprising:

a barrier conductive layer on a wall of the hole in the insulating layer.

25. The method of claim 24, wherein the barrier conductive layer comprises titanium.

26. The method of claim 14 further comprising the step of forming a capping layer on the second plug.

27. The method of claim 26, wherein the capping layer comprises titanium nitride.

28. The method of claim 14 wherein the step of forming the first conductive layer comprises forming the first conductive layer on a substrate and the recess having a uniform cross-section.

29. The method of claim 14 wherein the step of forming the first conductive layer comprises the step of forming the first conductive layer wherein a cross-section of the recess is greater than a cross-section of the hole.

30. The method of claim 14 wherein the step of forming the first conductive layer further comprises etching the first conductive layer to form the recess.

* * * * *